US009894750B2

(12) United States Patent
Khan et al.

(10) Patent No.: US 9,894,750 B2
(45) Date of Patent: Feb. 13, 2018

(54) FLOATING CONNECTOR SHIELD

(71) Applicant: 3M INNOVATIVE PROPERTIES COMPANY, St. Paul, MN (US)

(72) Inventors: Zulfiqar A. Khan, Austin, TX (US); Alexander W. Barr, Austin, TX (US); Alexander R. Mathews, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 80 days.

(21) Appl. No.: 14/651,748

(22) PCT Filed: Dec. 5, 2013

(86) PCT No.: PCT/US2013/073228
§ 371 (c)(1),
(2) Date: Jun. 12, 2015

(87) PCT Pub. No.: WO2014/099389
PCT Pub. Date: Jun. 26, 2014

(65) Prior Publication Data
US 2015/0327357 A1    Nov. 12, 2015

Related U.S. Application Data

(60) Provisional application No. 61/739,953, filed on Dec. 20, 2012.

(51) Int. Cl.
*H01P 5/00* (2006.01)
*H05K 1/02* (2006.01)
*H01P 3/02* (2006.01)
*H01P 3/08* (2006.01)

(52) U.S. Cl.
CPC ............. *H05K 1/0219* (2013.01); *H01P 3/02* (2013.01); *H01P 3/084* (2013.01)

(58) Field of Classification Search
CPC .......... H01P 3/02; H01P 3/084; H05K 1/0219
USPC .................................................. 333/204, 238
See application file for complete search history.

(56) References Cited

U.S. PATENT DOCUMENTS

| | | | |
|---|---|---|---|
| 6,600,395 B1 | 7/2003 | Handforth et al. |
| 6,758,695 B2 | 7/2004 | Pepe et al. |
| 6,786,771 B2 | 9/2004 | Gailos |
| 6,976,886 B2 | 12/2005 | Winings et al. |
| 7,581,990 B2 | 9/2009 | Kirk et al. |
| 7,722,401 B2 | 5/2010 | Kirk et al. |
| 2004/0048420 A1 | 3/2004 | Miller |

(Continued)

FOREIGN PATENT DOCUMENTS

| | | |
|---|---|---|
| EP | 2 209 172 | 7/2010 |
| JP | 2004-104382 | 4/2004 |

OTHER PUBLICATIONS

PCT International Search Report from PCT/US2013/073228, dated Mar. 21, 2014, 4 pages.

*Primary Examiner* — Robert J Pascal
*Assistant Examiner* — Kimberly Glenn
(74) *Attorney, Agent, or Firm* — Robert S. Moshrefzadeh

(57) ABSTRACT

The disclosure generally relates to shielded transmission lines, electrical systems including the shielded transmission lines, cables using shielded transmission lines, and electrical connectors using shielded transmission lines. In particular, the present disclosure provides transmission lines that include floating shields capable of isolating interference between conductors that can result in reduced crosstalk.

56 Claims, 5 Drawing Sheets

(56) References Cited

U.S. PATENT DOCUMENTS

| | | |
|---|---|---|
| 2006/0068640 A1 | 3/2006 | Gailus |
| 2008/0248660 A1 | 10/2008 | Kirk et al. |
| 2009/0181635 A1 | 7/2009 | Yamada |
| 2009/0231065 A1 | 9/2009 | Cheng et al. |

FLOATING CONNECTOR SHIELD

BACKGROUND

Transmission lines in printed circuit boards (PCBs), cables, and high-speed high-density connectors can suffer from mutual interference, known as crosstalk. Some of the factors that contribute to crosstalk in signal lines include the close proximity of conductors, as well as impedance mismatches and structural discontinuities such as conductor bends and size changes, PCB vias, and the like. Impedance mismatches and structural discontinuities may cause reflections in the current/voltage waves traveling on the signal lines. Such reflections may add constructively leading to a phenomenon known as resonance. Resonances occur at certain frequencies, known as resonant frequencies. At resonant frequencies, often a significant increase in crosstalk can be observed.

SUMMARY

The disclosure generally relates to shielded transmission lines, electrical systems including the shielded transmission lines, cables using shielded transmission lines, and electrical connectors using shielded transmission lines. In particular, the present disclosure provides transmission lines that include floating shields capable of isolating interference between conductors that can result in reduced crosstalk. In one aspect, the present disclosure provides an electrical system that includes a transmission line assembly having spaced apart first and second electrically conductive lines extending along a same first direction, each of the first and second electrically conductive lines comprising opposing broad top and bottom sides and opposing narrow edges, the broad bottom side of the first electrically conductive line facing the broad top side of the second electrically conductive line, the second electrically conductive line being connected to a ground, the first electrically conductive line not being connected to any ground; and a first dielectric material having a first dielectric constant and at least partially filling the space between the first and second electrically conductive lines. The electrical system further includes a shield extending along the first direction and not being connected to any ground, the shield at least partially surrounding and being spaced apart from the transmission line assembly; and a second dielectric material having a second dielectric constant less than the first dielectric constant at least partially filling the space between the shield and the transmission line assembly. In another aspect, the present disclosure provides an electrical connector that includes an insulative housing; and the electrical system disposed in the housing, the first electrically conductive line of the transmission line assembly forming a contact of the electrical connector and being adapted to make electrical contact with a corresponding contact of a mating connector.

In yet another aspect, the present disclosure provides an electrical system that includes a plurality of spaced apart transmission line assemblies extending along a same first direction, each transmission line assembly having spaced apart first and second electrically conductive lines extending along the first direction, each of the first and second electrically conductive lines including opposing broad top and bottom sides and opposing narrow edges, the broad bottom side of the first electrically conductive line facing the broad top side of the second electrically conductive line, the second electrically conductive line being connected to a ground, the first electrically conductive line not being connected to any ground; and a first dielectric material having a first dielectric constant and at least partially filling the space between the first and second electrically conductive lines. The electrical system further includes an ungrounded shield spaced apart from and disposed between adjacent transmission line assemblies; and a second dielectric material having a second dielectric constant less than the first dielectric constant at least partially filling the spaces between each ungrounded shield and each spaced apart transmission line assembly. In yet another aspect, the present disclosure provides an electrical connector that includes an insulative housing; and the electrical system disposed in the housing, the first electrically conductive line of the transmission line assembly forming a contact of the electrical connector and being adapted to make electrical contact with a corresponding contact of a mating connector.

In yet another aspect, the present disclosure provides an electrical system that includes an electrically conductive signal line having a first broadside and a first edge; an electrically conductive ground line spaced apart from and parallel to the signal line and having a second broadside and a second edge, the first broadside of the signal line facing the second broadside of the ground line; an ungrounded shield spaced apart from the signal and ground lines; a first dielectric material having a first dielectric constant disposed between the signal and ground lines; and a second dielectric material having a second dielectric constant less than the first dielectric constant disposed between the shield and both the signal and ground lines, the first and second dielectric materials improving a confinement of a signal propagating along the signal line to the space between the signal and ground lines, the improved confinement reducing loss due to the ungrounded shield. In yet another aspect, the present disclosure provides an electrical connector that includes an insulative housing; and the electrical system disposed in the housing, the first electrically conductive signal line forming a contact of the electrical connector and being adapted to make electrical contact with a corresponding contact of a mating connector.

In yet another aspect, the present disclosure provides an electrical system that includes a transmission line assembly and a shield assembly. The transmission line assembly includes spaced apart first and second electrically conductive lines extending along a same first direction, each of the first and second electrically conductive lines comprising opposing broad top and bottom sides and opposing narrow edges, the broad bottom side of the first electrically conductive line facing the broad top side of the second electrically conductive line; the second, but not the first, electrically conductive line being configured to be connected to a ground; and a first dielectric material having a first dielectric constant and at least partially filling the space between the first and second electrically conductive lines. The shield assembly extending along the first direction and surrounding the transmission line assembly and being electrically isolated from the transmission line assembly, the shield assembly including an inner lossy dielectric layer; and an outer metal layer disposed on the inner lossy dielectric layer. The electrical system further includes a second dielectric material having a second dielectric constant less than the first dielectric constant and at least partially filling the space between the shield assembly and the transmission line assembly.

The above summary is not intended to describe each disclosed embodiment or every implementation of the pres-

BRIEF DESCRIPTION OF THE DRAWINGS

Throughout the specification reference is made to the appended drawings, where like reference numerals designate like elements, and wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
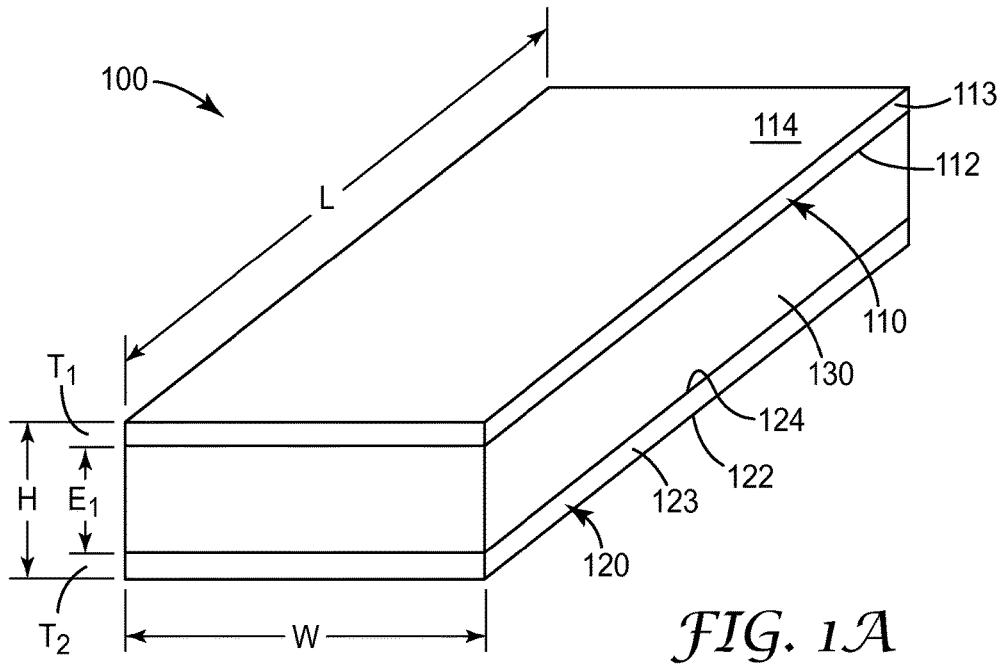
FIG. 1A shows a cross-sectional perspective schematic of a transmission line assembly.

The present disclosure provides a structure for metallic shields that does not require grounding, yet provides enhanced suppression of crosstalk in connectors and PCBs. In one particular embodiment, the structure incorporates lossy materials that can be used to dampen any parasitic currents that may be induced on the shield. As used herein, the term "lossy material" means a material that is capable of dissipating electromagnetic energy passing through the material.

In the following description, reference is made to the accompanying drawings that forms a part hereof and in which are shown by way of illustration. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

High speed electrical connectors, cables and printed circuit boards (PCBs) pack large number of conductors in dense spaces. Due to close proximity, electric signals on these conductors can mutually interfere, a phenomenon known as crosstalk. An effective way to avoid crosstalk is to use a metal shield between two adjacent conductors.

Metal shields, when sufficiently thick, do not allow interfering fields from one conductor to penetrate to the other side of the shield, thereby significantly reducing the crosstalk. However, when the shield is placed near a conductor carrying an electric current, an image current can be induced on the side of the metal shield adjacent to the conductor. This image current is electrically tightly coupled to the signal current flowing on the conductor.

Since a connector or a cable can be used to connect two PCBs, a conductor in the connector and/or cable is connected to a PCB on either side. As such, current on the conductor can flow from one PCB to another. However, the generated image of this current that flows on the shield cannot go beyond the physical boundaries of the shield. Therefore, it is common practice to connect shield edges to electrical grounds on each of the connected PCBs. These ground connections provide a continuous path for the image currents flowing on the shield.

Ideally, for each signal conductor in a connector, there must be a ground connection on either side of the shield. For example, a 100 pin connector can require a like number (that is, 100) of PCB ground connections to the shield edges on either side. In practice, due to limited space available on the PCB, only a few ground connections are practically available.

When a ground connection is not provided for a shield edge next to a conductor, the image current can undergo a reflection at the edge due to impedance mismatch, which can arise due to an abrupt discontinuity in the flow of the image current on the shield. For any shield and connector structure, there are a discrete set of frequencies for which such reflections could add constructively, leading to what is known as a resonance phenomenon.

At resonance, the crosstalk and electromagnetic radiations can become very large and the metal shield can become ineffective, if not counterproductive, by increasing the crosstalk. The resonance phenomenon becomes more pronounced at higher frequencies, so in general, a maximum frequency limit exists for every connector beyond which crosstalk levels become too high to effectively operate the connector.

Another way to reduce crosstalk (that is, without grounding) is by dampening shield resonances using electromagnetically lossy materials at selective points in connector structures. State-of-the-art connectors can employ electromagnetically lossy materials in their constructions. However, electromagnetically lossy materials can also attenuate a significant amount of signal energy. Therefore, using electromagnetically lossy materials in currently available connector structures has not been found to a viable solution to reduction and/or elimination of crosstalk.

As used herein, an electrical system can include multiple grounds that can be at different relative potentials, not all of which are zero. Each of the multiple grounds can vary due to noise, etc., however each of the grounds generally does not include a driven signal. Generally, it can be preferred that each of the grounds have a zero potential relative to any signal lines, although any of the grounds can have a nonzero potential. In some cases, a ground can have a substantially constant potential, so in some cases a power plane can be considered to be a ground.

In one particular embodiment, the electrical system design includes the way that the transmission lines are arranged within a connector shield. Contrary to the prevalent design where conductors are placed side by side, the structure described herein places the conductors such that their broad sides are facing each other. In some cases, a pair of two conductors can constitute one transmission line; in some cases, a set of three conductors can constitute one transmission line, as described elsewhere. A high permittivity material is placed between each pair of conductors. In this manner, most of the electromagnetic field energy associated with the signal resides between two conductors of a transmission line, thereby reducing cross talk with adjacent or nearby lines.

In one particular embodiment, three electrically conductive lines can be arranged such that the three electrically conductive lines are spaced on top of each other in a stack, such that the first electrically conductive line faces the third electrically conductive line, and the second electrically conductive line is disposed between the two. Each of the broad edges of the first, second and third electrically conductive lines face each other, and each narrow edge of the lines are adjacent each other. In this embodiment, each of the first, second, and third electrically conductive lines can lie stacked on top of each other, with dielectric material disposed between, as described elsewhere.

In one particular embodiment, three electrically conductive lines can be arranged such that two electrically conductive lines are spaced side by side such that the second narrow edge of the first electrically conductive line faces the first narrow edge of the second electrically line; and a third electrically conductive line spaced from the first and second electrically conductive lines such that the first narrow edge of the third conductive line is closer to the first narrow edge of the first conductive line and the second narrow edge of the third conductive line is closer to the second narrow edge of the second conductive line; the top broad edge of the third conductive line facing the bottom broad edge of the first and second conductive lines. In this embodiment, both of the first and second electrically conductive lines can lie in the same plane, disposed over the third electrically conductive line, as described elsewhere.

In one particular embodiment, any plurality of transmission lines can be arranged in a like manner, with pairs of conductors separated by high permittivity material and disposed such that their broad sides face each other to reduce crosstalk with adjacent lines. In some cases, transmission lines can be arranged such that each broad side faces an adjacent broad side, and each narrow side can face an adjacent narrow side; for example, four transmission lines that encompass eight conductors can be arranged in a rectangular fashion, as described elsewhere.

A metallic shield can be positioned to isolate each of the transmission lines. In one particular embodiment, the shield is not physically connected to any of the transmission lines such that the shield in the close proximity of a transmission line should not noticeably disturb the signal transmission. Such shields can be considered to be 'floating' shields. This arrangement of the floating shield can ensure that any image current that may be induced on the shield due to current travelling within the conductors of a transmission line is due to the interfering electromagnetic fields, and not due to the signal current.

As described elsewhere, since the floating shield has no ground contact (for example, no contact to any other component of the electrical system), it was previously discouraged and rarely practiced—a floating shield generally has severe resonances. Such a floating shield may also cause electromagnetic radiations to emanate from the structures, as currents have nowhere to go but to radiate from floating shields.

Contrary to these indications, the present inventors have surprisingly discovered that the resonating currents on the shield can be dampened by introducing electric and/or magnetic lossy materials such as carbon black, polymeric materials, inorganic materials, combinations thereof, and the like, positioned between the floating shield and the transmission lines. In one particular embodiment, the lossy material can be a sublayer disposed adjacent to the floating shield and removed from contact with the transmission lines. Since the floating shield is not carrying any significant signal current, any loss in the signal is minimal. Electromagnetic radiations are also reduced as antennas made with lossy materials are generally poor antennas. The electrically lossy material can be a coating applied to the floating shield, and/or incorporated within a polymer matrix.

In one aspect, a combination of material properties and shield structure can be designed to produce a floating shield with similar or better performance as compared to prevalent shield designs. The described structure significantly simplifies the prevalent shield design practice by eliminating ground connections. Saving in ground space on boards due to the inventive design is a major design improvement as it allows easier routing of traces on the PCB.

FIG. 1A shows a cross-sectional perspective schematic of a transmission line assembly 100, according to one aspect of the disclosure. Transmission line assembly 100 includes spaced apart first electrically conductive line 110 and second electrically conductive line 120, each of which have a thickness "T1" and "T2" respectively, a width "W", and extend along a first direction for a length "L". The first electrically conductive line 110 includes a first broad top side 114, a first narrow edge 113, and a first broad bottom side 112, and the second electrically conductive line 120 includes a second broad top side 124, a second narrow edge 123, and a second broad bottom side 122. The first and second electrically conductive lines 110, 120, are disposed so that the first broad bottom side 112 faces the second broad top side 124. In one particular embodiment, the second electrically conductive line 120 is connected electrically to a ground, and the first electrically conductive line 110 is not connected electrically to any ground. In some cases, the first electrically conductive line 110 is a first signal carrying line. A first dielectric material 130 having a first thickness "E1"

and a first dielectric constant ∈1, at least partially fills the space between the first and second electrically conductive lines 110, 120, resulting in an overall thickness "H" for the transmission line assembly 100. In some cases, the first dielectric material 130 can completely fill the space; however, in some cases, a different dielectric material, for example air gaps (not shown), can partially fill the space.

In one particular embodiment, the first and the second electrically conductive lines 110, 120, can be the same or different, and made from conductive materials including metals, metal alloys, metal composites, and the like, as known to one of skill in the art. Particularly preferred conductive materials include copper, silver, aluminum, gold, and the like. In one particular embodiment, the first dielectric material 130 can be made from insulative materials including polymers, inorganic materials, composites, and the like, as known to one of skill in the art. Particularly preferred insulative materials include Liquid Crystal Polymers (LCP), Teflon® or PTFE, Duroid® high frequency laminates available from Rogers Corporation, Rogers, Conn., glass, and the like. In some cases, the first and second thickness, "T1", "T2" can be the same or different, and can range from about 1 micron to about 100 microns in thickness. In some cases, a thickness of about 10 microns can be preferred.

Figure 1B:
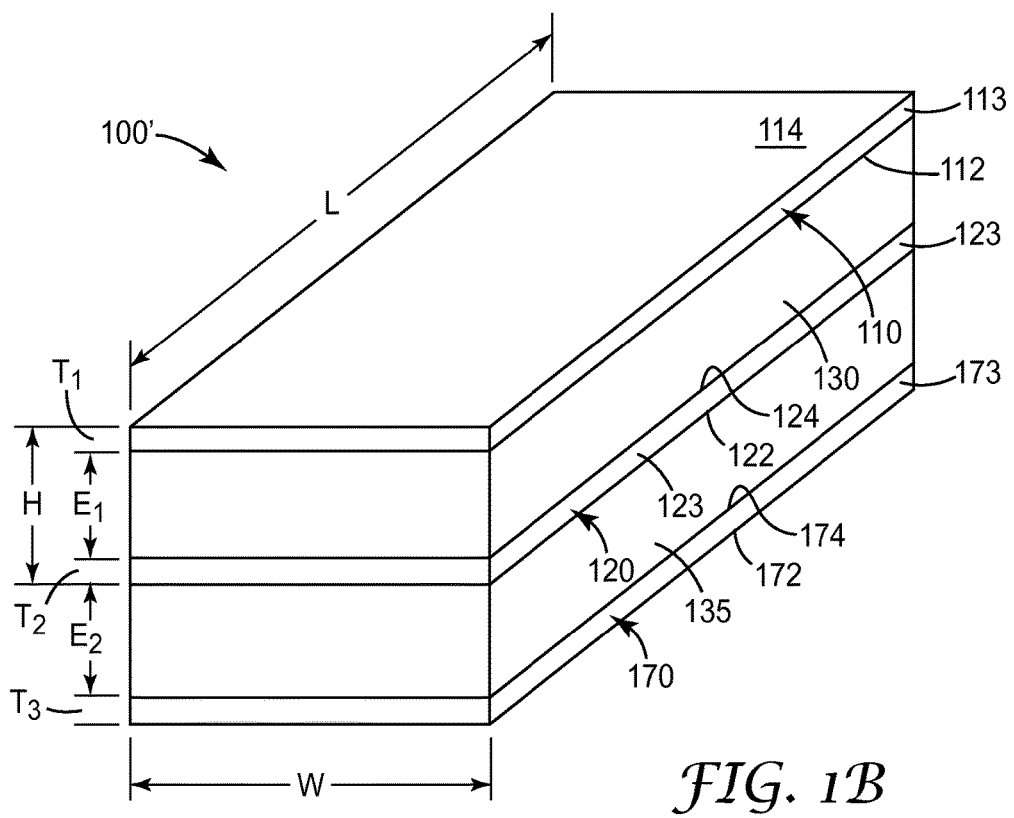
FIG. 1B shows a cross-sectional perspective schematic of a transmission line assembly.

FIG. 1B shows a cross-sectional perspective schematic of a transmission line assembly 100' forming a stack, according to one aspect of the disclosure. In one aspect, the transmission line assembly 100' can be referred to as a differential pair of conductive lines. Each of the elements 110-130 shown in FIG. 1B correspond to like-numbered elements 110-130 shown in FIG. 1A, which have been described previously. For example, first electrically conductive line 110 shown in FIG. 1B corresponds to first electrically conductive line 110 shown in FIG. 1A, and so on.

In FIG. 1B, a third electrically conductive line 170 is disposed beneath the second electrically conductive line 120. Third electrically conductive line 170 likewise has a thickness "T3", the width "W", and extends along the first direction for the length "L". The third electrically conductive line 170 includes a third broad top side 174, a third narrow edge 173, and a third broad bottom side 172. The second and third electrically conductive lines 120, 170, are disposed so that the second broad bottom side 122 faces the third broad top side 174. In one particular embodiment, the third electrically conductive line 170 is not connected electrically to any ground. In some cases, the third electrically conductive line 170 is a second signal carrying line. A third dielectric material 135 having a thickness "E2" and a third dielectric constant ∈3, at least partially fills the space between the second and third electrically conductive lines 120, 170. In some cases, the third dielectric material 135 can completely fill the space; however, in some cases, air gaps (not shown) can partially fill the space. In some cases, the first and third dielectric constants, "∈1", "∈3" can be the same or different; the first and second thickness "E1", "E2" can be the same or different; the first, second and third conductive materials can be the same or different; and/or the first, second, and third thickness, "T1", "T2", "T3" can be the same or different.

Figure 1C:
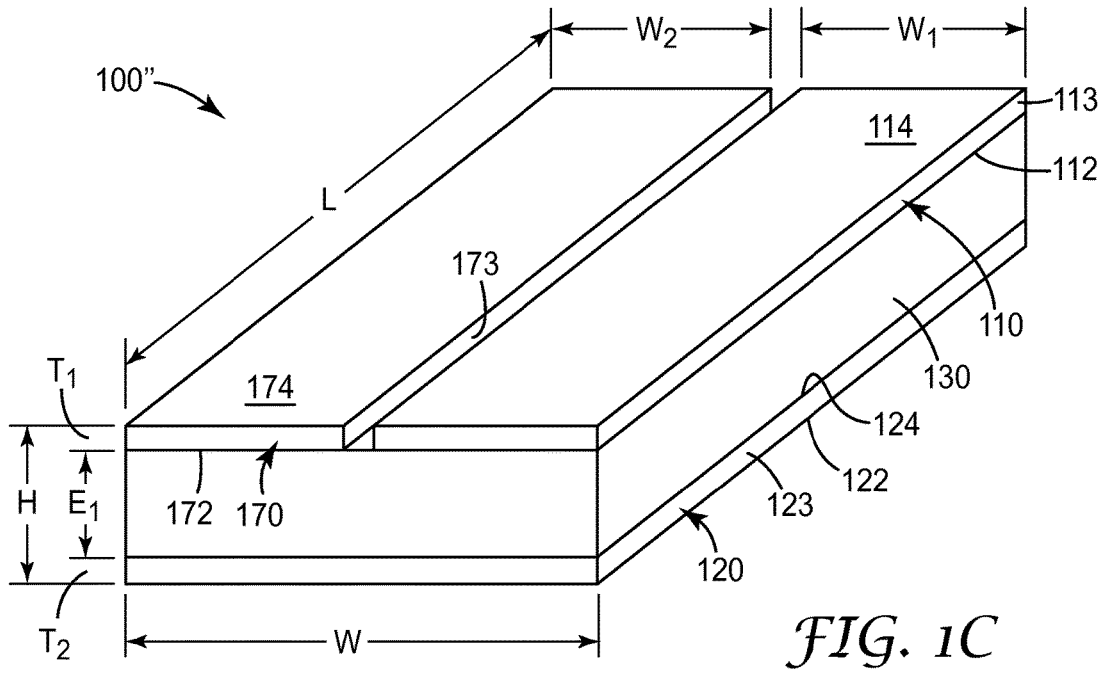
FIG. 1C shows a cross-sectional perspective schematic of a transmission line assembly.

FIG. 1C shows a cross-sectional perspective schematic of a transmission line assembly 100" where two conductive lines lie in a plane, according to one aspect of the disclosure. In one aspect, the transmission line assembly 100" can be referred to as a differential pair of conductive lines. Each of the elements 110-130 shown in FIG. 1C correspond to like-numbered elements 110-130 shown in FIG. 1B, which have been described previously. For example, first electrically conductive line 110 shown in FIG. 1C corresponds to first electrically conductive line 110 shown in FIG. 1B, and so on.

In FIG. 1C, a third electrically conductive line 170 is disposed adjacent the first electrically conductive line 110. First electrically conductive line 110 has a thickness "T1", a width "T1", and extends along the first direction for the length "L". Third electrically conductive line 170' likewise has a thickness "T1", a width "W2", and extends along the first direction for the length "L". The third electrically conductive line 170 includes a third broad top side 174, a third narrow edge 173, and a third broad bottom side 172. The first and third electrically conductive lines 110, 170, are disposed so that the first and third broad bottom sides 112, 172, each faces the second broad top side 124, and that there is a separation between third narrow side 173 and the narrow side of first electrically conductive line 110 shown opposite the first narrow side 113. In one particular embodiment, the third electrically conductive line 170 is not connected electrically to any ground. In some cases, the third electrically conductive line 170 is a second signal carrying line.

Figure 2:
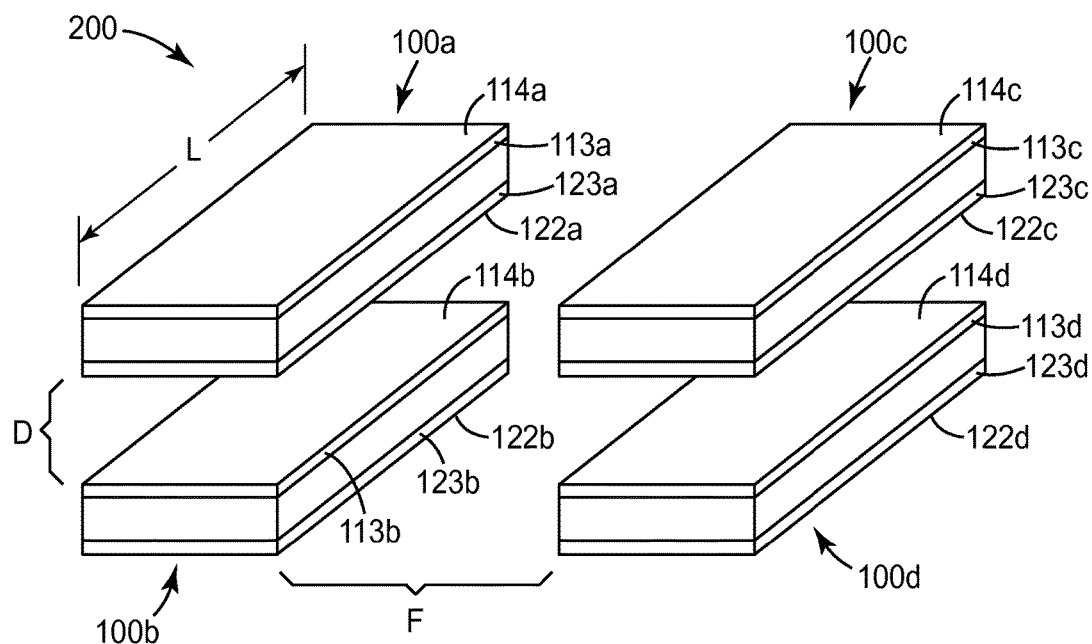
FIG. 2 shows a cross-sectional perspective schematic of a transmission line array.

FIG. 2 shows a cross-sectional perspective schematic of a transmission line array 200, according to one aspect of the disclosure. Each of the elements 100a-114d shown in FIG. 2 correspond to like-numbered elements 100-114 shown in FIG. 1A, which have been described previously. For example, first transmission line assembly 100a shown in FIG. 2 corresponds to first transmission line assembly 100 shown in FIG. 1A, and so on. In FIG. 2, transmission line array 200 includes a first, a second, a third, and a fourth transmission line assembly 100a, 100b, 100c, 100d, arranged so that opposing broad top and bottom sides (for example, first transmission line assembly 100a broad bottom side 122a and second transmission line assembly 100b broad top side 114b; third transmission line assembly 100c broad bottom side 122c and fourth transmission line assembly 100d broad top side 114d) face each other and are separated by a broad separation distance "D".

Further, first, second, third, and fourth transmission line assembly 100a, 100b, 100c, 100d, are arranged such that there is a narrow edge separation distance "F" between adjacent transmission line assemblies (for example, first transmission line assembly 100a first narrow edge 113a separated by edge separation distance "F" from the narrow side of the third transmission line assembly 100c opposite the third narrow edge 113c; and second transmission line assembly 100b second narrow edge 113b separated by edge separation distance "F" from the narrow side of the fourth transmission line assembly 100d opposite the fourth narrow edge 113d). In some embodiments, the broad separation distance "D" and the edge separation distance "F" can be the same or different, and can range from about 0.1 mm to about 10 mm, or from about 1 mm to about 5 mm, or about 1 mm.

Figure 3A:
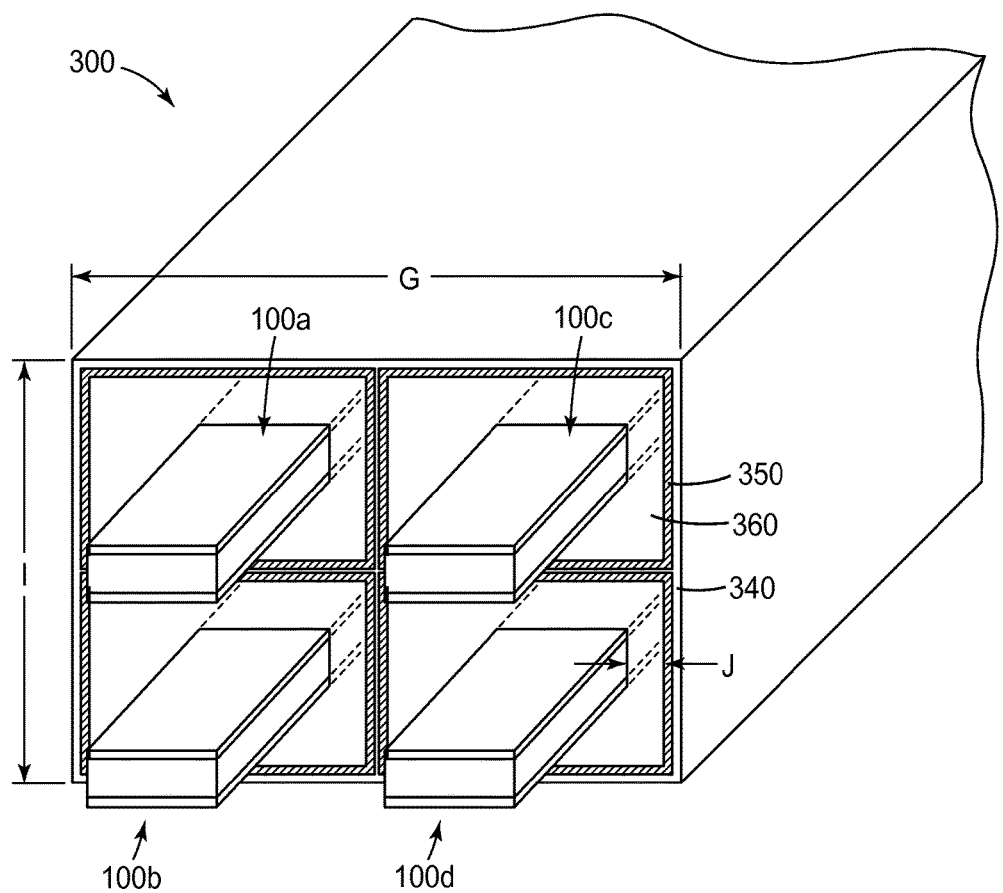
FIG. 3A shows a cross-sectional perspective schematic of an electrical system.

FIG. 3A shows a cross-sectional perspective schematic of an electrical system 300 that can also be described as a floating shield transmission line cable, according to one aspect of the disclosure. In FIG. 3A, the electrical system 300 includes first through fourth transmission line assemblies 100a-100d, which can be transmission line assemblies similar to element 100 shown in FIG. 1A, which has been described previously. It is to be understood, however, that any of the transmission line assemblies described herein can be substituted equally. Each of the elements 100a-100d shown in FIG. 3A correspond to like-numbered elements 100a-100d shown in FIG. 2, which have been described previously. For example, first transmission line assembly 100a shown in FIG. 3A corresponds to first transmission line assembly 100a shown in FIG. 2, and so on.

In FIG. 3A, electrical system 300 includes an ungrounded shield 340 spaced apart from and disposed between adjacent first, second, third and fourth transmission line assemblies 100a, 100b, 100c, 100d. A second dielectric material 360 having a second dielectric constant ∈2 is disposed and at least partially fills the space between each transmission line assembly and the ungrounded shield 340. In some cases, the second dielectric material 360 can completely fill the space; however, in some cases a different dielectric material, for example, air gaps (not shown) can partially fill the space. The second dielectric material 360 has a second dielectric thickness "J" that can range from about 0.1 mm to about 10 mm, or from about 0.1 mm to about 5 mm, or from about 0.1 mm to about 0.5 mm or about 0.45 mm. In one particular embodiment, a third dielectric material may be present, and the third dielectric material can be a lossy material 350. In one particular embodiment, the lossy material 350 can be a coating disposed adjacent to the ungrounded shield 340, as shown in the figure. In other embodiments, the lossy material 350 can be disposed anywhere throughout second dielectric material 360, and absorbs electromagnetic signals that pass through the material, as described elsewhere. Generally, it can be preferable to dispose the lossy material as far from the transmission line assemblies 100a-100d as possible, for example as a coating on the ungrounded shield 340, as shown in the figure. In one particular embodiment, the second dielectric constant ∈2 can range from about 1 to about 10, or from about 1 to about 8, or even from about 1 to about 4. In some cases, the second dielectric constant can preferably be about 3.

Figure 3B:
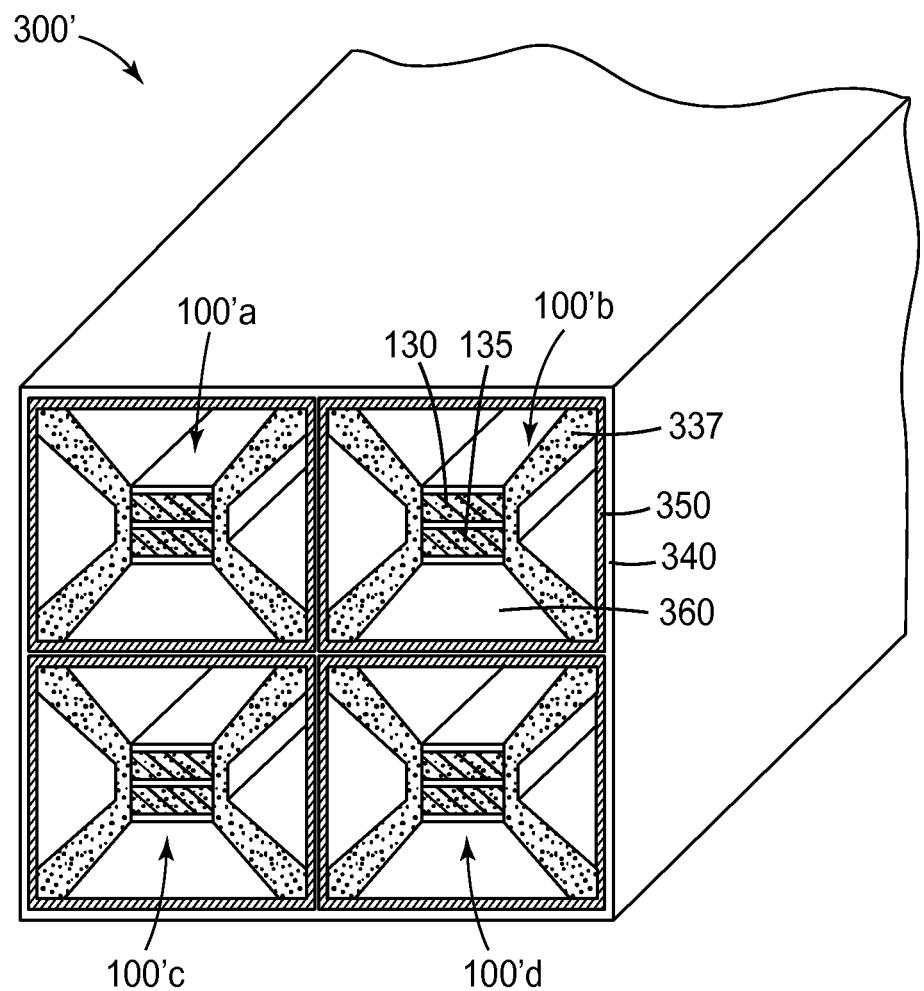
FIG. 3B shows a cross-sectional perspective schematic of an electrical system.

FIG. 3B shows a cross-sectional perspective schematic of an electrical system 300' that can also be described as a floating shield transmission line cable, according to one aspect of the disclosure. In FIG. 3B, the electrical system 300' includes suspended first through fourth transmission line assemblies 100a'-100d', which can be dual transmission line assemblies similar to element 100' shown in FIG. 1B, which have been described previously. It is to be understood, however, that any of the transmission line assemblies described herein can be substituted equally. Each of the elements 100a'-100d' shown in FIG. 3B correspond to like-numbered elements 100a-100d shown in FIG. 3A, which have been described previously. For example, first transmission line assembly 100a' shown in FIG. 3B corresponds to first transmission line assembly 100a shown in FIG. 3A, and so on.

In FIG. 3B, electrical system 300' includes an ungrounded shield 340 spaced apart from and disposed between adjacent first, second, third and fourth transmission line assemblies 100a', 100b', 100c', 100d'. A second dielectric material 360 having a second dielectric constant ∈2 is disposed and at least partially fills the space between each transmission line assembly and the ungrounded shield 340. In some cases, the second dielectric material 360 can completely fill the space; however, in some cases a different dielectric material, for example, air gaps can at least partially fill the space. The second dielectric material 360 can be any suitable dielectric material, including all of those described elsewhere.

In one particular embodiment, the second dielectric material 360 can be air, such that the first through fourth transmission line assemblies 100a'-100d' are supported by a fourth dielectric material 337 from the ungrounded shield 340, as shown in FIG. 3B. The fourth dielectric material 337 can suspend each of the first through fourth transmission line assemblies 100a'-100d' from the ungrounded shield 340 in the respective regions of the electrical system 300'. It is to be understood that although the fourth dielectric material 337 is shown in FIG. 3B as extension arms that extend in an "X" configuration from each transmission line assembly 100a'-100d', to each respective corner of the surrounding shield, any configuration that serves to support and suspend the transmission line assemblies can be used, as known to one of skill in the art.

In one particular embodiment, the fourth dielectric material 337 can be the same as the first and third dielectric material 130, 135, so that the electrical system 300' can be more readily assembled, for example using techniques including injection molding, extrusion molding, and the like. A lossy material 350 is disposed between each of the first through fourth transmission line assemblies 100a'-100d', respectively, and the ungrounded shield 340. The combination of the lossy material 350 and the ungrounded shield 340 can be referred to as a shield assembly, and the shield assembly both surrounds and is electrically isolated from each respective transmission line assembly. By "electrically isolated" components is meant that there is conductive isolation, inductive isolation, and/or capacitive isolation of the components.

In one particular embodiment, the lossy material 350 can be a coating disposed adjacent to the ungrounded shield 340, as shown in the figure. In other embodiments, the lossy material 350 can be disposed anywhere throughout the second dielectric material 360 and the fourth dielectric material 337, and absorbs electromagnetic signals that pass through the material, as described elsewhere. Generally, it can be preferable to dispose the lossy material as far from the transmission line assemblies 100a'-100d' as possible, for example as a coating on the ungrounded shield 340, as shown in the figure.

EXAMPLES

Figure 4:
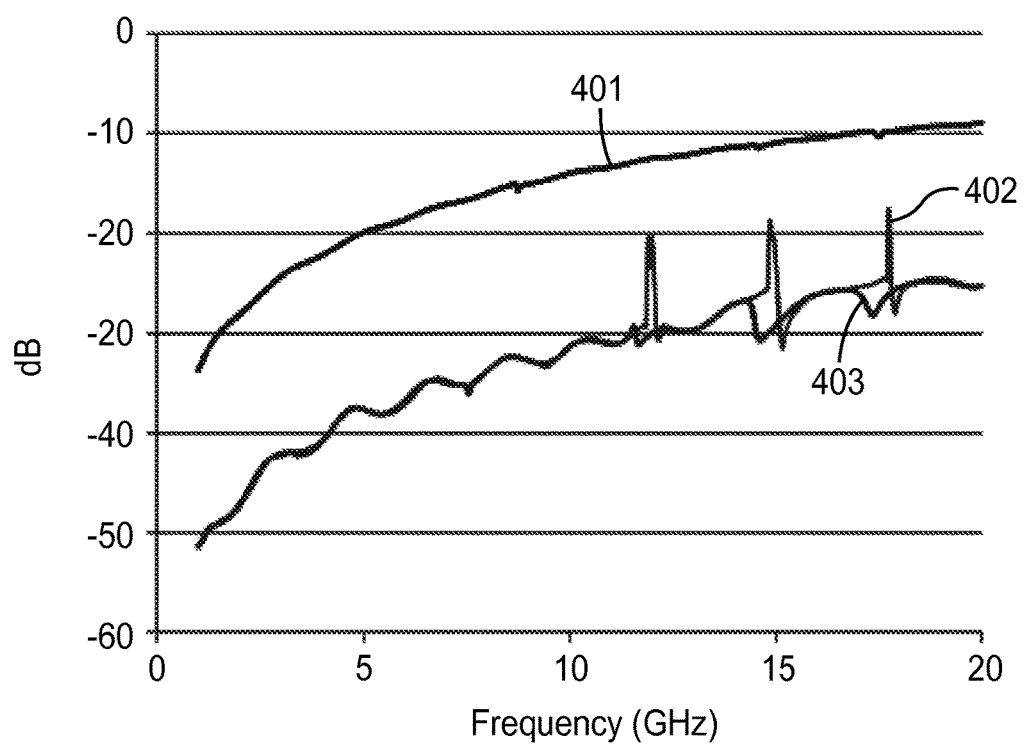
FIG. 4 shows a plot of calculated far end crosstalk for an electrical system.

A far-end crosstalk (FEXT) was calculated in four 50 mm long transmission lines enclosed in 46 mm long shield. FIG. 4 shows a plot of calculated far end crosstalk (FEXT) for an electrical system similar to the electrical system 300 shown in FIG. 3. Referring to the descriptions for FIGS. 1A, 2, and 3, the electrical system comprised an overall length L=50 mm and a shielded length of 46 mm (2 mm of the shield and second dielectric were removed from each end); overall width "G" equal to about 4.1 mm, and an overall height "I" equal to about 3.14 mm; first dielectric thickness E1=0.32 mm, first dielectric constant ∈1=4.2; first and second electrically conductive lines were Perfect Electrical Conductors (PEC) having thickness T1=T2=0.01 mm; width of conductors W=1 mm; broad separation distance D=1 mm; narrow separation distance F=1 mm; second dielectric thickness J=0.45 mm; and second dielectric constant ∈=10 with a loss tangent of 0.5.

In FIG. 4, plots of calculated dB crosstalk vs input signal frequency are shown for an unshielded assembly of 4 transmission lines (curve 401); an assembly of 4 transmission lines surrounded by the metal shield only (for example, element 340 in FIG. 3; curve 402); and an assembly of 4 transmission lines surrounded by the lossy material and the metal shield (for example, the electrical system shown in FIG. 3; curve 403). As can be seen in the plots, the metal shield, though significantly reducing crosstalk, introduces resonances in the structure. By incorporating the lossy material into the electrical system, the resonances disappear, effectively reducing the crosstalk about 10 dB. Several additional modeling experiments were completed, and the results consistently show from about 10 dB to about 20 dB suppression of crosstalk at the resonant frequencies.

Following are a list of embodiments of the present disclosure.

Item 1 is an electrical system comprising: a transmission line assembly, comprising: spaced apart first and second electrically conductive lines extending along a same first direction, each of the first and second electrically conductive lines comprising opposing broad top and bottom sides and opposing narrow edges, the broad bottom side of the first electrically conductive line facing the broad top side of the second electrically conductive line, the second electrically conductive line being connected to a ground, the first electrically conductive line not being connected to any ground; and a first dielectric material having a first dielectric constant and at least partially filling the space between the first and second electrically conductive lines; a shield extending along the first direction and not being connected to any ground, the shield at least partially surrounding and being spaced apart from the transmission line assembly; and a second dielectric material having a second dielectric constant less than the first dielectric constant at least partially filling the space between the shield and the transmission line assembly.

Item 2 is the electrical system of item 1, wherein the second dielectric material encloses the transmission line assembly.

Item 3 is the electrical system of item 2, wherein the shield encloses the second dielectric material.

Item 4 is the electrical system of item 1 to item 3, wherein the first dielectric material fills the entire space between the first and second electrically conductive lines.

Item 5 is the electrical system of item 1 to item 4, wherein the second dielectric material fills the entire space between the shield and the transmission line assembly.

Item 6 is the electrical system of item 1 to item 5, wherein the first and second electrically conductive lines have same widths.

Item 7 is the electrical system of item 1 to item 6, wherein the transmission line assembly further comprises a third electrically conductive line comprising opposing broad top and bottom sides and opposing narrow edges, the broad top side of the third electrically conductive line facing the broad bottom side of the second electrically conductive line, the third electrically conductive line not being connected to any ground, the first dielectric material at least partially filling the space between the third and second electrically conductive lines.

Item 8 is the electrical system of item 7, wherein the first dielectric material fills the entire space between the third and second electrically conductive lines.

Item 9 is the electrical system of item 7 to item 8, wherein the first, second, and third electrically conductive lines lie in a stack.

Item 10 is the electrical system of item 7 to item 9, wherein the first and third electrically conductive lines form a differential signal pair.

Item 11 is the electrical system of item 1 to item 6, wherein the transmission line assembly further comprises a third electrically conductive line comprising opposing broad top and bottom sides and opposing narrow edges, the third electrically conductive line edgewise adjacent the first electrically conductive line, the broad bottom side of the third electrically conductive line facing the broad top side of the second electrically conductive line, the third electrically conductive line not being connected to any ground, the first dielectric material at least partially filling the space between the third and second electrically conductive lines.

Item 12 is the electrical system of item 11, wherein the first dielectric material fills the entire space between the third and second electrically conductive lines.

Item 13 is the electrical system of item 11 or item 12, wherein the first and third electrically conductive lines lie in a same plane.

Item 14 is the electrical system of item 11 to item 13, wherein the first and third electrically conductive lines form a differential signal pair.

Item 15 is the electrical system of item 1 to item 14, further comprising a lossy third dielectric material disposed on an inner side of the shield, the second dielectric material being disposed between the lossy third dielectric material and the transmission line assembly.

Item 16 is the electrical system of item 15, wherein the lossy third dielectric material is electrically lossy, magnetically lossy, or a combination thereof.

Item 17 is the electrical system of item 15, wherein the lossy third dielectric material comprises carbon black, a polymeric material, an inorganic material, or a combination thereof.

Item 18 is an electrical system comprising: a plurality of spaced apart transmission line assemblies extending along a same first direction, each transmission line assembly comprising: spaced apart first and second electrically conductive lines extending along the first direction, each of the first and second electrically conductive lines comprising opposing broad top and bottom sides and opposing narrow edges, the broad bottom side of the first electrically conductive line facing the broad top side of the second electrically conductive line, the second electrically conductive line being connected to a ground, the first electrically conductive line not being connected to any ground; and a first dielectric material having a first dielectric constant and at least partially filling the space between the first and second electrically conductive lines; an ungrounded shield spaced apart from and disposed between adjacent transmission line assemblies; and a second dielectric material having a second dielectric constant less than the first dielectric constant at least partially filling the spaces between each ungrounded shield and each spaced apart transmission line assembly.

Item 19 is the electrical system of item 18, wherein the second dielectric material encloses the transmission line assembly.

Item 20 is the electrical system of item 18 or item 19, wherein the shield encloses the second dielectric material.

Item 21 is the electrical system of item 18 to item 20, wherein the first dielectric material fills the entire space between the first and second electrically conductive lines.

Item 22 is the electrical system of item 18 to item 21, wherein the second dielectric material fills the entire space between the shield and the transmission line assembly.

Item 23 is the electrical system of item 18 to item 22, wherein the first and second electrically conductive lines have same widths.

Item 24 is the electrical system of item 18 to item 23, wherein the transmission line assembly further comprises a third electrically conductive line comprising opposing broad top and bottom sides and opposing narrow edges, the broad top side of the third electrically conductive line facing the broad bottom side of the second electrically conductive line, the third electrically conductive line not being connected to any ground, the first dielectric material at least partially filling the space between the third and second electrically conductive lines.

Item 25 is the electrical system of item 24, wherein the first dielectric material fills the entire space between the third and second electrically conductive lines.

Item 26 is the electrical system of item 24 or item 25, wherein the first, second, and third electrically conductive lines lie in a stack.

Item 27 is the electrical system of item 24 to item 26, wherein the first and third electrically conductive lines form a differential signal pair.

Item 28 is the electrical system of item 18, wherein the transmission line assembly further comprises a third electrically conductive line comprising opposing broad top and bottom sides and opposing narrow edges, the third electrically conductive line edgewise adjacent the first electrically conductive line, the broad bottom side of the third electrically conductive line facing the broad top side of the second electrically conductive line, the third electrically conductive line not being connected to any ground, the first dielectric material at least partially filling the space between the third and second electrically conductive lines.

Item 29 is the electrical system of item 28, wherein the first dielectric material fills the entire space between the third and second electrically conductive lines.

Item 30 is the electrical system of item 28 or item 29, wherein the first and third electrically conductive lines lie in a same plane.

Item 31 is the electrical system of item 28 to item 30, wherein the first and third electrically conductive lines form a differential signal pair.

Item 32 is the electrical system of item 18 to item 31, further comprising a lossy third dielectric material disposed on an inner side of the shield, the second dielectric material being disposed between the lossy third dielectric material and the transmission line assembly.

Item 33 is the electrical system of item 18 to item 32, wherein the lossy third dielectric material is electrically lossy, magnetically lossy, or a combination thereof.

Item 34 is the electrical system of item 18 to item 33, wherein the lossy third dielectric material comprises carbon black, a polymeric material, an inorganic material, or a combination thereof.

Item 35 is an electrical connector comprising: an insulative housing; and the electrical system of item 1 to item 34 disposed in the housing, the first electrically conductive line of the transmission line assembly forming a contact of the electrical connector and being adapted to make electrical contact with a corresponding contact of a mating connector.

Item 36 is an electrical system comprising: an electrically conductive signal line having a first broadside and a first edge; an electrically conductive ground line spaced apart from and parallel to the signal line and having a second broadside and a second edge, the first broadside of the signal line facing the second broadside of the ground line; an ungrounded shield spaced apart from the signal and ground lines; a first dielectric material having a first dielectric constant disposed between the signal and ground lines; and a second dielectric material having a second dielectric constant less than the first dielectric constant disposed between the shield and both the signal and ground lines, the first and second dielectric materials improving a confinement of a signal propagating along the signal line to the space between the signal and ground lines, the improved confinement reducing a signal loss from the ungrounded shield.

Item 37 is the electrical system of item 36, wherein the first dielectric material fills the entire space between the electrically conductive signal line and the electrically conductive ground line.

Item 38 is the electrical system of item 36 or item 37, wherein the second dielectric material fills the entire space between the shield and both the signal and ground lines.

Item 39 is the electrical system of item 36 to item 38, wherein the signal and ground lines have same widths.

Item 40 is the electrical system of item 36 to item 39, further comprising a second electrically conductive signal line having a third broadside and an edge, the third broadside of the second electrically conductive signal line facing the second electrically conductive ground line opposite the first electrically conductive signal line, the third electrically conductive signal line not being connected to any ground, the first dielectric material disposed between the third electrically conductive signal line and second electrically conductive ground line.

Item 41 is the electrical system of item 40, wherein the first dielectric material fills the entire space between the third electrically conductive signal line and second electrically conductive ground line.

Item 42 is the electrical system of item 40 or item 41, wherein the first, second, and third electrically conductive lines lie in a stack.

Item 43 is the electrical system of item 40 to item 42, wherein the first and third electrically conductive signal lines form a differential signal pair.

Item 44 is the electrical system of item 36, further comprising a third electrically conductive signal line having a third broadside and an edge adjacent the first electrically conductive signal line, the third broadside of the second electrically conductive signal line facing the second broadside of the second electrically conductive ground line, the third electrically conductive signal line not being connected to any ground, the first dielectric material disposed between the third electrically conductive signal line and second electrically conductive ground line.

Item 45 is the electrical system of item 44, wherein the first dielectric material fills the entire space between the third electrically conductive signal line and second electrically conductive ground line.

Item 46 is the electrical system of item 44 or item 45, wherein the first and third electrically conductive lines lie in a same plane.

Item 47 is the electrical system of item 44 to item 46, wherein the first and third electrically conductive signal lines form a differential signal pair.

Item 48 is the electrical system of item 36, further comprising a lossy third dielectric material disposed on an inner side of the shield, the second dielectric material being disposed between the lossy third dielectric material and the transmission line assembly.

Item 49 is the electrical system of item 48, wherein the lossy third dielectric material is electrically lossy, magnetically lossy, or a combination thereof.

Item 50 is the electrical system of item 48, wherein the lossy third dielectric material comprises carbon black, a polymeric material, an inorganic material, or a combination thereof.

Item 51 is the electrical system of item 36 to item 50, wherein the signal loss comprises a reflection loss, an absorption loss, a radiation loss, or a combination thereof.

Item 52 is an electrical connector comprising: an insulative housing; and the electrical system of item 36 to item 51 disposed in the housing, the first electrically conductive signal line forming a contact of the electrical connector and being adapted to make electrical contact with a corresponding contact of a mating connector.

Item 53 is the electrical system of any of item 1 to item 52, wherein the ground is at a nonzero potential.

Item 54 is an electrical system comprising: a transmission line assembly, comprising: spaced apart first and second electrically conductive lines extending along a same first direction, each of the first and second electrically conductive lines comprising opposing broad top and bottom sides and opposing narrow edges, the broad bottom side of the first electrically conductive line facing the broad top side of the second electrically conductive line; the second, but not the first, electrically conductive line being configured to be connected to a ground; and a first dielectric material having a first dielectric constant and at least partially filling the space between the first and second electrically conductive lines; a shield assembly extending along the first direction and surrounding the transmission line assembly and being electrically isolated from the transmission line assembly, the shield assembly comprising: an inner lossy dielectric layer; and an outer metal layer disposed on the inner lossy dielectric layer; and a second dielectric material having a second dielectric constant less than the first dielectric constant and at least partially filling the space between the shield assembly and the transmission line assembly.

Item 55 is the electrical system of item 54, wherein the inner lossy dielectric layer is electrically lossy, magnetically lossy, or a combination thereof.

Item 56 is the electrical system of item 54 or item 55, wherein the inner lossy dielectric layer comprises carbon black, a polymeric material, an inorganic material, or a combination thereof.

Item 57 is the electrical system of item 54 to item 56, further comprising a plurality of extension arms, a first end of each extension being attached to the transmission line assembly, an opposite second end of each extension arm being attached to the shield assembly, the plurality of extension arms keeping the transmission line assembly suspended within an enclosure defined by the shield assembly.

Item 58 is the electrical system of item 57, wherein each extension arm comprises the second dielectric material.

Item 59 is the electrical system of item 57 or item 58, wherein each extension arm comprises the first dielectric material.

Unless otherwise indicated, all numbers expressing feature sizes, amounts, and physical properties used in the specification and claims are to be understood as being modified by the term "about". Accordingly, unless indicated to the contrary, the numerical parameters set forth in the foregoing specification and attached claims are approximations that can vary depending upon the desired properties sought to be obtained by those skilled in the art utilizing the teachings disclosed herein.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. An electrical system comprising:
a transmission line assembly, comprising:
spaced apart first and second electrically conductive lines extending along a same first direction, each of the first and second electrically conductive lines comprising opposing broad top and bottom sides and opposing narrow edges, the broad bottom side of the first electrically conductive line facing the broad top side of the second electrically conductive line, the second electrically conductive line being connected to a ground, the first electrically conductive line not being connected to any ground, and
a first dielectric material having a first dielectric constant and at least partially filling the space between the first and second electrically conductive lines;
a shield extending along the first direction and not being connected to any ground, the shield at least partially surrounding and being spaced apart from the transmission line assembly; and
a second dielectric material having a second dielectric constant less than the first dielectric constant at least partially filling the space between the shield and the transmission line assembly, wherein the transmission line assembly further comprises a third electrically conductive line comprising opposing broad top and bottom sides and opposing narrow edges, the broad top side of the third electrically conductive line facing the broad bottom side of the second electrically conductive line, the third electrically conductive line not being connected to any ground, the first dielectric material at least partially filling the space between the third and second electrically conductive lines.

2. The electrical system of claim 1, wherein the second dielectric material encloses the transmission line assembly.

3. The electrical system of claim 2, wherein the shield encloses the second dielectric material.

4. The electrical system of claim 1, wherein the first dielectric material fills the entire space between the first and second electrically conductive lines.

5. The electrical system of claim 1, wherein the second dielectric material fills the entire space between the shield and the transmission line assembly.

6. The electrical system of claim 1, wherein the first and second electrically conductive lines have same widths.

7. The electrical system of claim 1, wherein the first dielectric material fills the entire space between the third and second electrically conductive lines.

8. The electrical system of claim 1, wherein the first, second, and third electrically conductive lines lie in a stack.

9. The electrical system of claim 7, wherein the first and third electrically conductive lines form a differential signal pair.

10. The electrical system of claim 1, wherein the ground is at a nonzero potential.

11. An electrical system comprising:
a transmission line assembly, comprising:
spaced apart first and second electrically conductive lines extending along a same first direction, each of the first and second electrically conductive lines comprising opposing broad top and bottom sides and opposing narrow edges, the broad bottom side of the first electrically conductive line facing the broad top side of the second electrically conductive line, the second electrically conductive line being connected to a ground the first electrically conductive line not being connected to any ground; and a first dielectric material having a first dielectric constant and at least partially filling the space between the first and second electrically conductive lines;

a shield extending along the first direction and not being connected to any ground, the shield at least partially surrounding and being spaced apart from the transmission line assembly, and a second dielectric material having a second dielectric constant less than the first dielectric constant at least partially filling the space between the shield and the transmission line assembly, wherein the transmission line assembly further comprises a third electrically conductive line comprising opposing broad top and bottom sides and opposing narrow edges, the third electrically conductive line edgewise adjacent the first electrically conductive line, the broad bottom side of the third electrically conductive line facing the broad top side of the second electrically conductive line, the third electrically conductive line not being connected to any ground, the first dielectric material at least partially filling the space between the third and second electrically conductive lines.

12. The electrical system of claim 11, wherein the first dielectric material fills the entire space between the third and second electrically conductive lines.

13. The electrical system of claim 11, wherein the first and third electrically conductive lines lie in a same plane.

14. The electrical system of claim 11, wherein the first and third electrically conductive lines form a differential signal pair.

15. An electrical system comprising:
a transmission line assembly, comprising:
spaced apart first and second electrically conductive lines extending along a same first direction, each of the first and second electrically conductive lines comprising opposing broad top and bottom sides and opposing narrow edges, the broad bottom side of the first electrically conductive line facing the broad top side of the second electrically conductive line, the second electrically conductive line being connected to a ground, the first electrically conductive line not being connected to any ground; and a first dielectric material having a first dielectric constant and at least partially filling the space between the first and second electrically conductive lines;

a shield extending along the first direction and not being connected to any ground, the shield at least partially surrounding and being spaced apart from the transmission line assembly, a second dielectric material having a second dielectric constant less than the first dielectric constant at least partially filling the space between the shield and the transmission line assembly, and a lossy third dielectric material disposed on an inner side of the shield, the second dielectric material being disposed between the lossy third dielectric material and the transmission line assembly.

16. The electrical system of claim 15, wherein the lossy third dielectric material is electrically lossy, magnetically lossy, or a combination thereof.

17. The electrical system of claim 15, wherein the lossy third dielectric material comprises carbon black, a polymeric material, an inorganic material, or a combination thereof.

18. An electrical system of comprising:
a plurality of spaced apart transmission line assemblies extending along a same first direction, each transmission line assembly comprising:
spaced apart first and second electrically conductive lines extending along the first direction, each of the first and second electrically conductive lines comprising opposing broad top and bottom sides and opposing narrow edges, the broad bottom side of the first electrically conductive line facing the broad top side of the second electrically conductive line, the second electrically conductive line being connected to a ground, the first electrically conductive line not being connected to any ground; and a first dielectric material having a first dielectric constant and at least partially filling the space between the first and second electrically conductive lines;

an ungrounded shield spaced apart from and disposed between adjacent transmission line assemblies; and a second dielectric material having a second dialectic constant less than the first dielectric constant at least partially filling the spaces between each ungrounded shield and each spaced apart transmission line assembly, wherein the transmission line assembly further comprises a third electrically conductive line comprising opposing broad top and bottom sides and opposing narrow edges, the broad top side of the third electrically conductive line facing the broad bottom side of the second electrically conductive line, the third electrically conductive line not being connected to any ground, the first dielectric material at least partially filling the space between the third and second electrically conductive lines.

19. The electrical system of claim 18, wherein the second dielectric material encloses the transmission line assembly.

20. The electrical system of claim 19, wherein the shield encloses the second dielectric material.

21. The electrical system of claim 18, wherein the first dielectric material fills the entire space between the first and second electrically conductive lines.

22. The electrical system of claim 18, wherein the second dielectric material fills the entire space between the shield and the transmission line assembly.

23. The electrical system of claim 18, wherein the first and second electrically conductive lines have same widths.

24. The electrical system of claim 18, wherein the first dielectric material fills the entire space between the third and second electrically conductive lines.

25. The electrical system of claim 18, wherein the first, second, and third electrically conductive lines lie in a stack.

26. The electrical system of claim 18, wherein the first and third electrically conductive lines form a differential signal pair.

27. An electrical system comprising:
a plurality of spaced apart transmission line assemblies extending along a same first direction, each transmission line assembly comprising:
spaced apart first and second electrically conductive lines extending along the first direction, each of the first and second electrically conductive lines comprising opposing broad top and bottom sides and opposing narrow edges, the broad bottom side of the first electrically conductive line facing the broad top side of the second electrically conductive line, the second electrically conductive line being connected to a ground, the first electrically conductive line not being connected to any ground; and a first dielectric material having a first dielectric constant and at least partially filling the space between the first and second electrically conductive lines;

an ungrounded shield spaced apart from and disposed between adjacent transmission line assemblies; and a second dielectric material having a second dielectric constant less than the first dielectric constant at least partially filling the spaces between each ungrounded shield and each spaced apart transmission line assembly, wherein the transmission line assembly further comprises a third electrically conductive line comprising opposing broad top and bottom sides and opposing narrow edges, the third electrically conductive line edgewise adjacent the first electrically conductive line, the broad bottom side of the third electrically conductive line facing the broad top side of the second electrically conductive line, the third electrically conductive line not being connected to any ground, the first dielectric material at least partially filling the space between the third and second electrically conductive lines.

28. The electrical system of claim 27, wherein the first dielectric material fills the entire space between the third and second electrically conductive lines.

29. The electrical system of claim 27, wherein the first and third electrically conductive lines lie in a same plane.

30. The electrical system of claim 1, wherein the first and third electrically conductive lines form a differential signal pair.

31. An electrical system of comprising:
a plurality of spaced apart transmission line assemblies extending along a same first direction, each transmission line assembly comprising:
spaced apart first and second electrically conductive lines extending along the first direction, each of the first and second electrically conductive lines comprising opposing broad top and bottom sides and opposing narrow edges, the broad bottom side of the first electrically conductive line facing the broad top side of the second electrically conductive line, the second electrically conductive line being connected to a ground, the first electrically conductive line not being connected to any ground; and
a first dielectric material having a first dielectric constant and at least partially filling the space between the first and second electrically conductive lines;
an ungrounded shield spaced apart from and disposed between adjacent transmission line assemblies; and
a second dielectric material having a second dialectic constant less than the first dielectric constant at least partially filling the spaces between each ungrounded shield and each spaced apart transmission line assembly; and
a lossy third dielectric material disposed on an inner side of the shield, the second dielectric material being disposed between the lossy third dielectric material and the transmission line assembly.

32. The electrical system of claim 31, wherein the lossy third dielectric material is electrically lossy, magnetically lossy, or a combination thereof.

33. The electrical system of claim 31, wherein the lossy third dielectric material comprises carbon black, a polymeric material, an inorganic material, or a combination thereof.

34. An electrical connector comprising:
an insulative housing; and
the electrical system of any of the preceding claims disposed in the housing, the first electrically conductive line of the transmission line assembly forming a contact of the electrical connector and being adapted to make electrical contact with a corresponding contact of a mating connector.

35. An electrical system comprising:
an electrically conductive signal line having a first broadside and a first edge;
an electrically conductive round line spaced apart from and parallel to the signal line and having a second broadside and a second edge, the first broadside of the signal line facing the second broadside of the ground line;
an ungrounded shield spaced apart from the signal and ground lines;
a first dielectric material having a first dielectric constant disposed between the signal and ground lines;
a second dielectric material having a second dielectric constant less than the first dielectric constant disposed between the shield and both the signal and ground lines, the first and second dielectric materials improving a confinement of a signal propagating along the signal line to the space between the signal and ground lines, the improved confinement reducing a signal loss from the ungrounded shield; and
a second electrically conductive signal line having a third broadside and an edge, the third broadside of the second electrically conductive signal line facing the second electrically conductive ground line opposite the first electrically conductive signal line, the third electrically conductive signal line not being connected to any ground, the first dielectric material disposed between the third electrically conductive signal line and second electrically conductive ground line.

36. The electrical system of claim 35, wherein the first dielectric material fills the entire space between the electrically conductive signal line and the electrically conductive ground line.

37. The electrical system of claim 35, wherein the second dielectric material fills the entire space between the shield and both the signal and ground lines.

38. The electrical system of claim 35, wherein the signal and ground lines have same widths.

39. The electrical system of claim 35, wherein the first dielectric material fills the entire space between the third electrically conductive signal line and second electrically conductive ground line.

40. The electrical system of claim 35, wherein the first, second, and third electrically conductive lines lie in a stack.

41. The electrical system of claim 35, wherein the first and third electrically conductive signal lines form a differential signal pair.

42. An electrical system comprising:
an electrically conductive signal line having a first broadside and a first edge;
an electrically conductive round line spaced apart from and parallel to the signal line and having a second broadside and a second edge, the first broadside of the signal line facing the second broadside of the ground line;
an ungrounded shield spaced apart from the signal and ground lines;
a first dielectric material having a first dielectric constant disposed between the signal and ground lines;
a second dielectric material having a second dielectric constant less than the first dielectric constant disposed between the shield and both the signal and ground lines, the first and second dielectric materials improving a confinement of a signal propagating along the signal line to the space between the signal and ground lines, the improved confinement reducing a signal loss from the ungrounded shield; and a third electrically conductive signal line having a third broadside and an edge adjacent the first electrically conductive signal line, the third broadside of the second electrically conductive signal line facing the second broadside of the second electrically conductive ground line, the third electrically conductive signal line not being connected to any ground, the first dielectric material disposed between the third electrically conductive signal line and second electrically conductive ground line.

43. The electrical system of claim 42, wherein the first dielectric material fills the entire space between the third electrically conductive signal line and second electrically conductive ground line.

44. The electrical system of claim 42, wherein the first and third electrically conductive lines lie in a same plane.

45. The electrical system of claim 42, wherein the first and third electrically conductive signal lines form a differential signal pair.

46. An electrical system comprising:
an electrically conductive signal line having a first broadside and a first edge,
an electrically conductive round line spaced apart from and parallel to the signal line and having a second broadside and a second edge, the first broadside of the signal line facing the second broadside of the ground line;
an ungrounded shield spaced apart from the signal and ground lines;
a first dielectric material having a first dielectric constant disposed between the signal and ground lines;
a second dielectric material having a second dielectric constant less than the first dielectric constant disposed between the shield and both the signal and ground lines, the first and second dielectric materials improving a confinement of a signal propagating along the signal line to the space between the signal and ground lines, the improved confinement reducing a signal loss from the ungrounded shield; and
a lossy third dielectric material disposed on an inner side of the shield, the second dielectric material being disposed between the lossy third dielectric material and the transmission line assembly.

47. The electrical system of claim 46, wherein the lossy third dielectric material is electrically lossy, magnetically lossy, or a combination thereof.

48. The electrical system of claim 46, wherein the lossy third dielectric material comprises carbon black, a polymeric material, an inorganic material, or a combination thereof.

49. An electrical system comprising:
an electrically conductive signal line having a first broadside and a first edge;
an electrically conductive round line spaced apart from and parallel to the signal line and having a second broadside and a second edge, the first broadside of the signal line facing the second broadside of the ground line;
an ungrounded shield spaced apart from the signal and ground lines;
a first dielectric material having a first dielectric constant disposed between the signal and ground lines;
a second dielectric material having a second dielectric constant less than the first dielectric constant disposed between the shield and both the signal and ground lines, the first and second dielectric materials improving a confinement of a signal propagating along the signal line to the space between the signal and ground lines, the improved confinement reducing a signal loss from the ungrounded shield, wherein the signal loss comprises a reflection loss, an absorption loss, a radiation loss, or a combination thereof.

50. An electrical connector comprising:
an insulative housing; and
an electrical system disposed in the housing, the electrical system comprising:
an electrically conductive signal line having a first broadside and a first edge;
an electrically conductive round line spaced apart from and parallel to the signal line and having a second broadside and a second edge, the first broadside of the signal line facing the second broadside of the ground line;
an ungrounded shield spaced apart from the signal and ground lines;
a first dielectric material having a first dielectric constant disposed between the signal and ground lines; and
a second dielectric material having a second dielectric constant less than the first dielectric constant disposed between the shield and both the signal and ground lines, the first and second dielectric materials improving a confinement of a signal propagating along the signal line to the space between the signal and ground lines, the improved confinement reducing a signal loss from the ungrounded shield, the first electrically conductive signal line forming a contact of the electrical connector and being adapted to make electrical contact with a corresponding contact of a mating connector.

51. An electrical system comprising:
a transmission line assembly, comprising:
spaced apart first and second electrically conductive lines extending along a same first direction, each of the first and second electrically conductive lines comprising opposing broad top and bottom sides and opposing narrow edges, the broad bottom side of the first electrically conductive line facing the broad top side of the second electrically conductive line; the second, but not the first, electrically conductive line being configured to be connected to a ground; and
a first dielectric material having a first dielectric constant and at least partially filling the space between the first and second electrically conductive lines;
a shield assembly extending along the first direction and surrounding the transmission line assembly and being electrically isolated from the transmission line assembly, the shield assembly comprising:
an inner lossy dielectric layer, and
an outer metal layer disposed on the inner lossy dielectric layer, and
a second dielectric material having a second dielectric constant less than the first dielectric constant and at least partially filling the space between the shield assembly and the transmission line assembly.

52. The electrical system of claim 51, wherein the inner lossy dielectric layer is electrically lossy, magnetically lossy, or a combination thereof.

53. The electrical system of claim 51, wherein the inner lossy dielectric layer comprises carbon black, a polymeric material, an inorganic material, or a combination thereof.

54. The electrical system of claim 51, further comprising a plurality of extension arms, a first end of each extension being attached to the transmission line assembly, an opposite second end of each extension arm being attached to the shield assembly, the plurality of extension arms keeping the transmission line assembly suspended within an enclosure defined by the shield assembly.

55. The electrical system of claim 54, wherein each extension arm comprises the second dielectric material.

56. The electrical system of claim 54, wherein each extension arm comprises the first dielectric material.

* * * * *

UNITED STATES PATENT AND TRADEMARK OFFICE
CERTIFICATE OF CORRECTION

PATENT NO. : 9,894,750 B2
APPLICATION NO. : 14/651748
DATED : February 13, 2018
INVENTOR(S) : Zulfiqar Khan et al.

It is certified that error appears in the above-identified patent and that said Letters Patent is hereby corrected as shown below:

In the Specification

Column 7
Line 1, delete "81," and insert -- $\varepsilon 1$, --

Column 10
Line 53, delete "$\varepsilon=10$" and insert -- $\varepsilon 2=10$ --

In the Claims

Column 16
Line 16, in Claim 1, delete "ground," and insert -- ground; --
Line 53, in Claim 9, delete "claim 7," and insert -- claim 1, --

Column 17
Line 1, in Claim 11, delete "ground" and insert -- ground, --
Line 52, in Claim 15, delete "assembly," and insert -- assembly; --

Column 18
Line 1, in Claim 18, after "system" delete "of"
Line 21, in Claim 18, delete "dialectic" and insert -- dielectric --

Column 19
Line 29, in Claim 31, after "system" delete "of"
Line 48, in Claim 31, after "assemblies," delete "and"
Line 49, in Claim 31, delete "dialectic" and insert -- dielectric --

Signed and Sealed this
First Day of May, 2018

Andrei Iancu
*Director of the United States Patent and Trademark Office*

CERTIFICATE OF CORRECTION (continued)
U.S. Pat. No. 9,894,750 B2

Column 20
Line 7, in Claim 35, delete "round" and insert -- ground --
Line 13, in Claim 35, delete "lines;" and insert -- lines, --
Line 54, in Claim 42, delete "round," and insert -- ground --

Column 21
Line 24, in Claim 46, delete "edge," and insert -- edge; --
Line 25, in Claim 46, delete "round" and insert -- ground --
Line 55, in Claim 49, delete "round" and insert -- ground --
Line 63, in Claim 49, after "lines;" insert -- and --

Column 22
Line 12, in Claim 50, delete "round" and insert -- ground --
Line 50, in Claim 51, delete "layer," and insert -- layer; --
Line 52, in Claim 51, delete "layer," and insert -- layer; --